(12) United States Patent
Chan et al.

(10) Patent No.: US 8,829,942 B2
(45) Date of Patent: Sep. 9, 2014

(54) COMPARATOR AND CALIBRATION THEREOF

(71) Applicant: University of Macau, Macau (CN)

(72) Inventors: Chi-Hang Chan, Macau (CN); Yan Zhu, Macau (CN); U-Fat Chio, Macau (CN); Sai-Weng Sin, Macau (CN); Seng-Pan U, Macau (CN); Rui Paulo da Silva Martins, Macau (CN)

(73) Assignee: University of Macau, Macau (CN)

( * ) Notice: Subject to any disclaimer, the term of this patent is extended or adjusted under 35 U.S.C. 154(b) by 37 days.

(21) Appl. No.: 13/675,311

(22) Filed: Nov. 13, 2012

(65) Prior Publication Data

US 2014/0132307 A1   May 15, 2014

(51) Int. Cl.
   *H03K 5/22*   (2006.01)
(52) U.S. Cl.
   USPC ............................................. 327/65; 327/89
(58) Field of Classification Search
   USPC .................... 327/63, 65, 89, 208, 218, 55, 57
   See application file for complete search history.

(56) References Cited

U.S. PATENT DOCUMENTS

| | | | |
|---|---|---|---|
| 5,162,681 A * | 11/1992 | Lee ................................. | 327/53 |
| 6,184,722 B1 * | 2/2001 | Hayakawa ...................... | 327/55 |
| 6,714,053 B2 * | 3/2004 | Mohan ............................ | 327/65 |
| 6,825,696 B2 * | 11/2004 | Jaussi et al. .................... | 327/55 |
| 8,188,768 B2 * | 5/2012 | Bae et al. ........................ | 327/66 |
| 8,339,158 B2 * | 12/2012 | Li et al. .......................... | 327/57 |
| 2008/0007312 A1 * | 1/2008 | Clark et al. ................... | 327/218 |
| 2009/0108881 A1 * | 4/2009 | Wilson ........................... | 327/57 |
| 2012/0119790 A1 * | 5/2012 | Chen .............................. | 327/65 |

OTHER PUBLICATIONS

Chi-Hang Chan, Yan Zhu, U-Fat Chio, Sai-Weng Sin, Seng-Pan U, Rui Paulo da Silva Martins, "A reconfigurable low-noise dynamic comparator with offset calibration in 90nm CMOS," in Proc. of IEEE Asian Solid-State Circuits Conference—ASSCC 2011, pp. 233-236, Jeju, Korea, Nov. 14-16, 2011.

* cited by examiner

*Primary Examiner* — Quan Tra
(74) *Attorney, Agent, or Firm* — Bacon & Thomas, PLLC (57) ABSTRACT

A comparator is provided and the comparator includes a comparing input unit and a latching unit. Wherein, the comparing input unit has a first input receiving a first comparing signal and has a second input receiving a second comparing signal. The comparing input unit drives a first intermediate node signal at a first intermediate node depending on the first comparing signal according to a first strobe signal, and the comparing input unit drives a second intermediate node signal at a second intermediate node depending on the second comparing signal according to the first strobe signal. The latching unit determines a comparing result according to at least one of the first intermediate node signal and the second intermediate node signal. In addition, the latching unit latches the comparing result according to a second strobe signal.

19 Claims, 8 Drawing Sheets

COMPARATOR AND CALIBRATION THEREOF

BACKGROUND OF THE INVENTION

1. Field of the Invention

The present invention is related to a comparator whose power, resolution and offset are reconfigurable, and, in particular, to a comparator with calibration function.

2. Description of the Related Art

Comparators are very important building blocks in Analog to Digital Converters (ADCs) since they are the components which transfer an analog difference to the digital logic. For the ADCs without intrinsic gain and error correction between each bit quantization, such as flash or successive approximation, the comparators have a stringent requirement imposing low noise, low power and high speed of operation. In a prior art, single stage dynamic comparator shave numbers of cascading transistors from supply voltage to ground so as to limit the overdrive voltage of the input transistors. As a result, it restricts the period of the input transistors operating in saturation region and degrades the comparator's noise performance. In another prior art, a two stage dynamic comparator was presented. However, the usage of PMOS output-latch stage reduces the driving current at the load and the usage of $1^{st}$ stage outputs as the clock signals of $2^{nd}$ stage limits the duration for the input transistors to operate in the saturation region and leads to larger delay variation across different inputs voltage.

Besides, low noise, low offset is another critical concern in the design of ADCs. Usually, offset calibration with digital control is implemented to suppress the offset voltage by inserting unbalance capacitance at the comparator outputs or adding an extra input pair of transistors. But, these methods either degrade the speed of the comparator with extra output loads or increase its design complexity and area by adding extra bias voltage and capacitor for the calibration input transistors pair.

SUMMARY OF THE INVENTION

The present invention is directed to a comparator. The comparator includes a comparing input unit and a latching unit. Wherein, the comparing input unit has a first input receiving a first comparing signal and has a second input receiving a second comparing signal. The comparing input unit drives a first intermediate node signal at a first intermediate node depending on the first comparing signal according to a first strobe signal, and the comparing input unit drives a second intermediate node signal at a second intermediate node depending on the second comparing signal according to the first strobe signal. The latching unit receives the first intermediate node signal from the first intermediate node and receives the second intermediate node signal from the second intermediate node. The latching unit determines a comparing result according to at least one of the first intermediate node signal and the second intermediate node signal. In addition, the latching unit latches the comparing result according to a second strobe signal.

According to an embodiment of the present invention, the comparator further comprises a calibration unit. The calibration unit is coupled on the path where the latching unit receiving a power voltage. The calibration unit has a first calibration input receiving a first calibration signal and has a second calibration input receiving a second calibration signal. Wherein, the calibration unit calibrates the comparing result according to at least one of the first calibration signal and the second calibration signal when the inputs of the comparator are in a common mode.

According to an embodiment of the present invention, an interval between the time when the first strobe signal is enabled and the time when the second strobe signal is enabled is greater than 10 pico-second and less than 60 pico-second.

Accordingly, the present invention offers a low noise, and high speed comparator. Furthermore, according to an embodiment, the present invention offers a high speed dynamic comparator with calibration. In addition, since the comparing input unit drives intermediate node signals according to the first strobe signal which is different from the second strobe signal which is accorded by the latching unit. Therefore, the comparator of the present invention shows a better driving capability and its speed is less sensitive to the input of the comparator.

Further features and aspects of the present invention will become apparent from the following detailed description of embodiments with reference to the attached drawings.

BRIEF DESCRIPTION OF THE DRAWINGS

The accompanying drawings, which are incorporated in and constitute a part of the specification, illustrate exemplary embodiments, features, and aspects of the invention and, together with the description, serve to explain the principles of the invention.

DESCRIPTION OF THE EMBODIMENTS

Various exemplary embodiments, features, and aspects of the invention will be described in detail below with reference to the drawings. For the drawings below, the same or the similar numbers and symbols are referred to the same or the similar elements.

Figure 1:
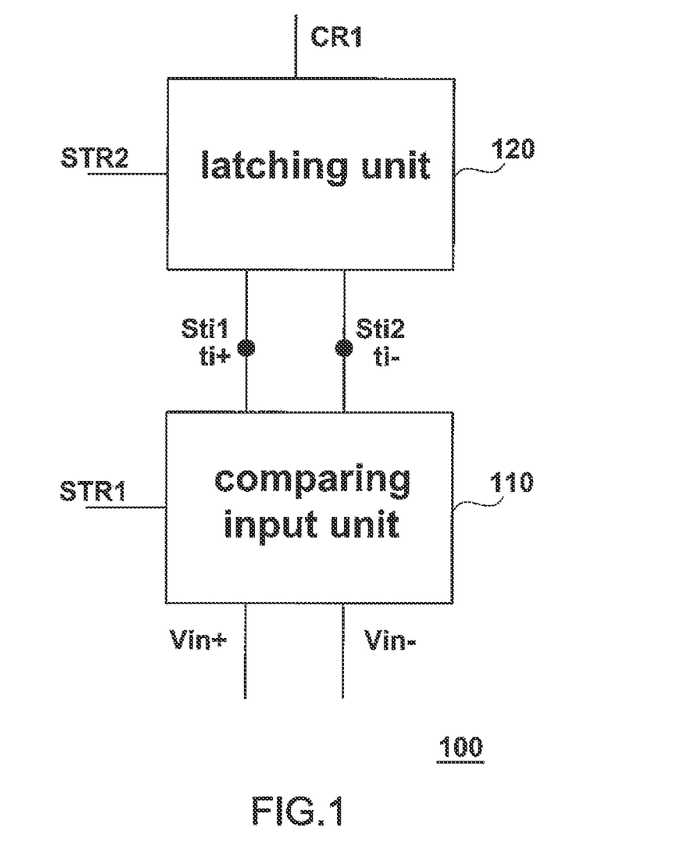
FIG. 1 shows a schematic view of function block of a comparator 100 according to an embodiment of the present invention.

FIG. 1 shows a schematic view of function block of a comparator 100 according to an embodiment of the present invention. Referring to FIG. 1, the comparator 100 includes a comparing input unit 110 and a latching unit 120. The comparing input unit 110 has two inputs used to receive comparing signals Vin+ and Vin− respectively. In addition, the comparing input unit 110 receives a strobe signal STR1 and the comparing input unit 110 has two outputs coupled to intermediate nodes ti+ and ti− respectively. The latching unit 120 has two inputs coupled to the intermediate nodes ti+ and ti− respectively and the latching unit 120 receives a strobe signal STR2.

In a practical implementation, the comparator 100 compares the comparing signal Vin+ with the comparing signal Vin− according to the strobe signal STR1. According to an embodiment of the invention, the comparator 100 starts performing a comparing function while receiving the strobe signal STR1 with e.g. a high voltage level. At this time, the comparing input unit 110 drives an intermediate node signal Sti1 depending on the comparing signal Vin+ at the intermediate node ti+. Likewise, the comparing input unit 110 drives an intermediate node signal Sti2 depending on the comparing signal Vin− at the intermediate node ti−. Then, the latching unit 120 receives the intermediate node signals Sti1 and Sti2 through the two inputs thereof respectively. The latching unit 120 determines a comparing result CR1 according to the intermediate node signals Sti1 and Sti2, and the latching unit 120 latches the comparing result CR1 according to the strobe signal STR2. According to an embodiment of the invention, the latching unit 120 might be generating the comparing result CR1 by keeping tracing the intermediate nod signals Sti1 and Sti2. Until the latching unit 120 receives the strobe signal STR2 with e.g. a high voltage level, the latching unit 120 latches the comparing result CR1 at the output thereof. Finally, a user of the comparator 100 might get the result of comparison according to the latched comparing result CR1. Herein, it is noticeable that the comparator performs comparing according to the strobe signals STR1 and STR2 with high voltage levels. However, according to other aspects, the comparator may be activated according to strobe signals with low voltage levels or according to some specific waveforms and the aspects are not limited in this invention.

Figure 2:
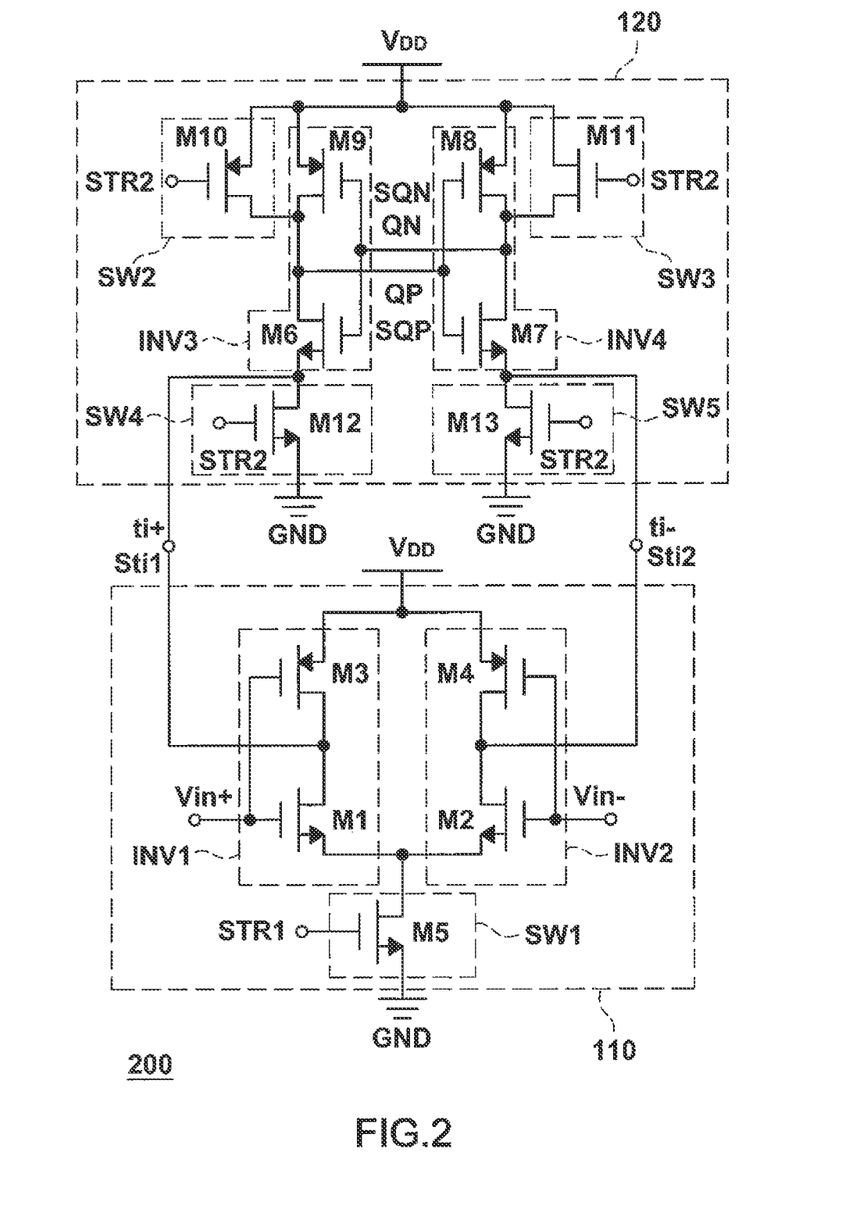
FIG. 2 shows a schematic circuit view of a comparator 200 according to an embodiment of the invention.

FIG. 2 shows a schematic circuit view of a comparator 200 according to an embodiment of the invention. Referring to FIG. 2, the comparator 200 includes a comparing input unit 110 and a latching unit 120.

The comparing input unit 110 includes inverters INV1 and INV2 and a switch SW1. According to an embodiment of the invention, the inverter INV1 has a power terminal receiving a power voltage VDD, has a ground terminal coupled to a ground voltage GND through the switch SW1, has an input receiving a comparing signal Vin+, and has an output coupled to an intermediate node ti+. The inverter INV2 has a power terminal receiving a power voltage VDD, has a ground terminal coupled to the ground voltage GND via the switch SW1, has an input receiving a comparing signal Vin−, and has an output coupled to an intermediate node ti−. Besides, the switch SW1 is coupled between the ground voltage GND and ground terminals of the inverters INV1 and INV2. The switch SW1 has a control terminal receiving a strobe signal STR1. According to an embodiment of the invention, when the switch SW1 receives the strobe signal STR1 with e.g. a high voltage level, the switch SW1 is turned on and electrically connects the ground voltage GND to the ground terminals of the inverters INV1 and INV2.

Specifically, take a specific case as an example such as the voltage level of the comparing signal Vin+ is greater than the voltage level of the comparing signal Vin−. When the switch SW1 receives the strobe signal STR1 with e.g. a high voltage level, the switch SW1 is turned on so as to allow the inverters INV1 and INV2 to receive the ground voltage GND and then the inverters INV1 and INV2 are activated. Meanwhile, the inverter INV1 drives the intermediate node signal Sti1 at the intermediate node ti+ with a voltage level lower than the voltage level driven by the inverter INV2 at the intermediate node ti− since the voltage level of the comparing signal Vin+ received by the inverter INV1 is greater than the voltage level of the comparing signal Vin− received by the inverter INV2. Likewise, according to another embodiment, when the voltage level of the comparing signal Vin+ is lower than the voltage level of the comparing signal Vin−, the voltage level of the intermediate node signal Sti1 is greater than the voltage level of the intermediate node signal Sti2.

The latching unit 120 includes inverters INV3 and INV4 and switches SW2, SW3, SW4, and SW5. The inverter INV3 has a power terminal receiving a power voltage VDD, has a ground terminal receiving the intermediate node signal Sti1 at the intermediate node ti+ and also coupled to a ground voltage GND via the switch SW4, has an input receiving a result signal SQN at a result node QN, and has an output generating a result signal SQP at a result node QP. The inverter INV4 has a power terminal receiving a power voltage VDD, has a ground terminal receiving the intermediate node signal Sti2 at the intermediate node ti− and also coupled to a ground voltage GND via the switch SW5, has an input coupled to the result node QP to receive the result signal SQP, and has an output generating the result signal SQN at the result node QN. The switch SW2 has two terminals coupled between a power voltage VDD and the result node QP and the switch SW3 has two terminals coupled between a power voltage VDD and the result node QN. Control terminals of the switches SW2 and SW3 receive a strobe signal STR2 and the switches SW2 and SW3 are turned on according to a first state of the strobe signal STR2. Additionally, the switch SW4 has two terminals coupled between the ground terminal of the inverter INV3 and a ground voltage GND and the switch SW5 has two terminals coupled between the ground terminal of the inverter INV4 and a ground voltage GND. The switches SW4 and SW5 have control terminals receiving the strobe signal STR2. Besides, the switches SW4 and SW5 are turned on according to a second state of the strobe signal STR2 wherein the second state of the strobe signal STR2 might be different from the first state of the strobe signal STR1.

According to an embodiment of the invention, the switches SW2 and SW3 are turned on and the switches SW4 and SW5 are turned off initially according to the first state of the strobe signal STR2. Herein, the first state of the strobe signal STR2 may be e.g. a low voltage level. At this time, the result nodes QN and QP are pre-charged to a high voltage such as a power voltage VDD via the turned-on switches SW2 and SW3. Then, when the latching unit 120 receives the strobe signal STR2 in the second state, the switches SW2 and SW3 are turned off and the switches SW4 and SW5 are turned on according to the second state of the strobe signal STR2. Besides, the second state of the strobe signal STR2 may be e.g. a high voltage level. In the meantime, the inverters INV3 and INV4 are coupled to a ground voltage through the turned-on switches SW4 and SW5.

Take a specific case as an example such as the voltage level of the comparing signal Vin+ is greater than the voltage level of the comparing signal Vin−. After the comparing input unit 110 receiving the strobe signal STR1 with e.g. a high voltage level, the voltage level of the intermediate node signal Sti1 is driven lower than the voltage level of the intermediate node signal Sti2. Meanwhile, the inverters INV3 and INV4 receive the intermediate signals Sti1 and Sit2 at the ground terminals thereof respectively. When the inverters INV3 and INV4 receive the intermediate signals Sti1 and Sti2 respectively, the inverters INV3 and INV4 are activated. At this time, the result signal SQP at the result node QP is driven by the inverter INV3 and the result signal SQN at the result node QN is driven by the inverter INV4. Since the voltage level of the intermediate signal Sti1 received by the inverter INV3 is lower than the voltage level of the intermediate signal Sti2 received by the inverter INV4, the voltage level of the result signal SQP driven by the inverter INV3 is lower than the voltage level of the result signal SQN driven by the inverter INV4.

Then, when receiving the second state of the strobe signal STR2 such as e.g. a high voltage level, the switches SW2 and SW3 are turned off and the switches SW4 and SW5 are turned on accordingly. After the switches SW4 and SW5 are turn on, the inverters INV3 and INV4 are electrically coupled to a ground voltage GND via the switches SW4 and SW5 respectively. Thus, the inverters INV3 and INV4 are operating dynamically as back-to-back inverters. Because the voltage level of the result signal SQP is lower than the voltage level of the result signal SQN, the result signal SQP is driven down to a ground voltage GND faster than the result signal SQN is driven when the switches SW4 and SW5 are turned on. When the voltage level of the result signal SQP is driven down to near a ground voltage level GND, the inverter INV4 which receives the result signal SQP drives the result signal SQN up to near a high voltage level such as a power voltage VDD. On the other hand, the inverter INV3 which receives the result signal SQN also maintains the voltage level of the result signal SQP at e.g. a ground voltage level. Accordingly, a comparing result is latched by the back-to-back inverters INV3 and INV4 and the comparing result is determined according to at least one of result signals SQP and SQN.

In this case described above, the comparing result is determined according to the high voltage level of at least one of the result signals SQN and SQP, or according to the low voltage level of at least one of the result signals SQP and SQN, or according to a value of a voltage difference between the result signals SQN and SQP. However, the determination of the comparing result of the invention is not limited to the voltage level states described above.

Similarly, if the voltage level of the comparing signal Vin+ is less than the voltage level of the comparing signal Vin−, the result signal SQP will be driven up to a high voltage level such as a power voltage VDD by the inverter INV3 and the result signal SQN will be driven down to a low voltage level such as a ground voltage GND by the inverter INV4. Then, the comparing result is also determined accordingly.

According to an embodiment of the invention, the inverter INV1 of the comparing input unit 110 includes a transistor M1 (e.g. an n-type transistor) and a transistor M3 (e.g. a p-type transistor). A gate of the transistor M1 receives the first comparing signal Vin+, and a source of the transistor M1 is coupled to the switch SW1, and a drain of the transistor M1 is coupled to the intermediate node ti+. A gate of the transistor M3 receives the comparing signal Vin+, and a source of the transistor M3 receives a power voltage VDD, and the drain of the transistor M3 is coupled to the drain of the transistor M1.

The inverter INV2 of the comparing input unit 110 includes a transistor M2 (e.g. an n-type transistor) and a transistor M4 (e.g. a p-type transistor). A gate of the transistor M2 receives the comparing signal Vin−, and a source of the transistor M2 is coupled to the switch SW1, and a drain of the transistor M2 is coupled to the intermediate node ti−. A gate of the transistor M4 receives the comparing signal Vin−, and a source of the transistor M4 receives a power voltage VDD, and a drain of the transistor M4 is coupled to the drain of the transistor M2. In addition, the switch SW1 of the comparing input unit 110 includes a transistor M5 (e.g. an n-type transistor). A gate of the transistor M5 receives the strobe signal STR1, and a source of the transistor M5 receives a ground voltage GND, and a drain of the transistor M5 is coupled to the ground terminals of the inverters INV1 and INV2, that is, the drain of the transistor M5 is coupled to both the sources of the transistors M1 and M2.

According to an embodiment of the invention, the inverter INV3 of the latching unit 120 includes a transistor M6 (e.g. an n-type transistor) and a transistor M9 (e.g. a p-type transistor). A gate of the transistor M6 receives the comparing signal SQN at the result node QN, and a source of the transistor M6 is coupled to the intermediate node ti+, and a drain of the transistor M6 is coupled to the result node QP. A gate of the transistor M9 receives the result signal SQN, and a source of the transistor M9 receives a power voltage VDD, and a drain of the transistor M9 is coupled to the drain of the transistor M6. Besides, the inverter INV4 of the latching unit 120 includes a transistor M7 (e.g. an n-type transistor) and a transistor M5 (e.g. a p-type transistor). A gate of the transistor M7 receives the result signal SQP, and a source of the transistor M7 is coupled to the intermediate node ti−, and a drain of the transistor M7 is coupled to the result node QN. In addition, a gate of the transistor M8 receives the result signal SQP, and a source of the transistor M8 receives a power voltage VDD, and a drain of the transistor M8 is coupled to the drain of the transistor M7.

According to an embodiment of the invention, the switch SW2 of the latching unit 120 includes a transistor M10 (e.g. a p-type transistor). A gate of the transistor M10 receives the strobe signal STR2, and a source of the transistor M10 receives a power voltage VDD, and a drain of the transistor M10 is coupled to the result node QP. The switch SW3 of the latching unit 120 includes a transistor M11 (e.g. a p-type transistor). A gate of the transistor M11 receives the strobe signal STR2, and a source of the transistor M11 receives a power voltage VDD, and a drain of the transistor M11 is coupled to the result node QN. The switch SW4 of the latching unit 120 includes a transistor M12 (e.g. an n-type transistor). A gate of the transistor M12 receives the strobe signal STR2, and a source of the transistor M12 receives a ground voltage GND, and a drain of the transistor M12 is coupled to the ground terminal of the inverter INV3, i.e., the drain of the transistor M12 is coupled to the source of the transistor M6. Additionally, the switch SW5 of the latching unit 120 includes a transistor M13 (e.g. an n-type transistor). A gate of the transistor M13 receives the strobe signal STR2, and a source of the transistor M13 receives a ground voltage GND, and a drain of the transistor M13 is coupled to the ground terminal of the inverter INV4, i.e., the drain of the transistor M13 is coupled to the source of the transistor M7.

Figure 3:
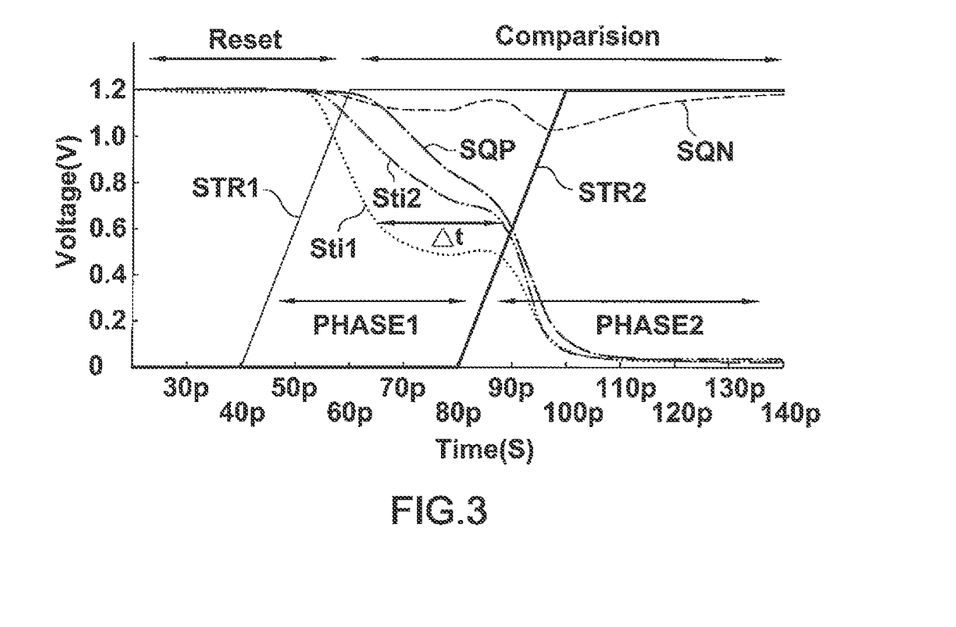
FIG. 3 shows a waveform of strobe signals, intermediate node signals, and result signals when the comparator 200 of FIG. 2 operates under the case that the comparing signal Vin+ is greater than the comparing signal Vin− according to an embodiment of the invention.

FIG. 3 shows a waveform of strobe signals, intermediate node signals, and result signals when the comparator 200 of FIG. 2 operates under the case that the comparing signal Vin+ is greater than the comparing signal Vin− according to an embodiment of the invention. Referring to both FIG. 2 and FIG. 3, in an embodiment, the comparator 200 may operate during different phases according to the strobe signals STR1 and STR2. For example, during a reset phase, both the strobe signals STR1 and STR2 are at e.g. low level voltage such as a ground voltage GND (STR1=0 and STR2=0). Thus, the transistors M5, M12, and M13 are turned off and the transistors M10 and M11 are turned on. At this time, the intermediate node ti+, the intermediate node ti−, the result node QN, the result node QP are all pre-charged to e.g. a power voltage VDD.

Afterwards, when the comparator 200 operates a function of comparison, two phases PHASE1 and PHASE2 are employed. During a comparing phase PHASE1, the strobe signal STR1 is enabled to e.g. a high voltage level such as a power voltage VDD (STR1=1 and STR2=0). Then, the transistor M5 is turned on so that the inverter INV1 formed with the transistors M1 and M3 and the inverter INV2 formed with the transistors M2 and M4 are established dynamically. Under the case when the comparing signal Vin+ is greater than the comparing signal Vin−, the intermediate node ti+ is discharged to ground by the inverter INV1 faster than the intermediate node ti− is discharged to ground by the inverter INV2, that is, the intermediate signal Sti1 is driven down to a ground voltage GND faster than the intermediate signal Sti2. Furthermore, the inverter INV3 formed with the transistors M6 and M9 and the inverter INV4 formed with the transistors M7 and M8 receives the intermediate signals Sti1 and Sti2 respectively so that the result node QP is discharged to ground faster than the result node QN is discharged, that is, the result signal SQP is driven down to a ground voltage GND by the inverter INV3 faster than the result signal SQN driven down by the inverter INV4. Meanwhile, a current path is formed from a power voltage VDD to a ground voltage through dynamic inverters INV1 and INV2 which include transistors M1-M4. Said another way, the intermediate nodes ti+ and ti− are discharge with a time difference Δt (as shown in FIG. 3) depending on the inputs (Vin+ and Vin−) of the comparator 200 and the skew rate of the dynamic inverters INV1 and INV2. During the comparing phase PHASE1, transistors M10 and M11 are still on and provide other comparing current paths to the comparing input unit 110 through the transistors M6 and M7 so as to keep the transistors M1 and M2 saturated.

During a latching phase PHASE2, the strobe signal STR2 is enabled to e.g. a high voltage level such as a power voltage VDD (STR1=1 and STR2=1). Then, the transistors M10 and M11 are turned off and the transistors M12 and M13 are turned on. In the meantime, a first latching current path is formed from a power voltage VDD via the transistor M9, the transistor M6, and the transistor M12 to a ground voltage GND. Also, a second latching current path is formed from a power voltage VDD via the transistor M8, the transistor M7, and the transistor M13 to a ground voltage GND. In other words, since the transistors M12 and M13 are turned on, the inverters INV3 and INV4 are formed as back-to-back inverters. Therefore, the latching unit 120 regenerates the current difference from the comparing input unit 110 to a logic level VDD or ground GND at the nodes QP and QN.

Moreover, since the latching current paths are formed via fewer transistors than the comparing current paths are formed, the comparator 200 latches the comparing result stably during the comparing phase PHASE2. Specifically, the transistors M12 and M13 are used for speeding up the regeneration time of the back-to-back inverters INV3 and INV4 and the turn on time of the transistors M12 and M13 controls the power consumption of the comparator 200. During the comparing phase PHASE1 of comparison, the regenerative inverter INV3 stacks with the transistors M1 and M5 from a power voltage VDD to a ground voltage GND which limits the regeneration speed. In the meantime, the regeneration has begun depending on the inputs (Vin+ and Vin−) of the comparator 200 and this regeneration process is not reversible because of the positive feedback of the back-to-back inverters INV3 and INV4. Thus, it is possible to add an extra pull down path to shorten the regeneration time after the regeneration process begins. As a result, delay between the strobe signals STR1 and STR2 can control the dynamic gain of the comparing input unit 110, which affects the power consumption, resolution, and offset of the comparator 200.

Figure 4:
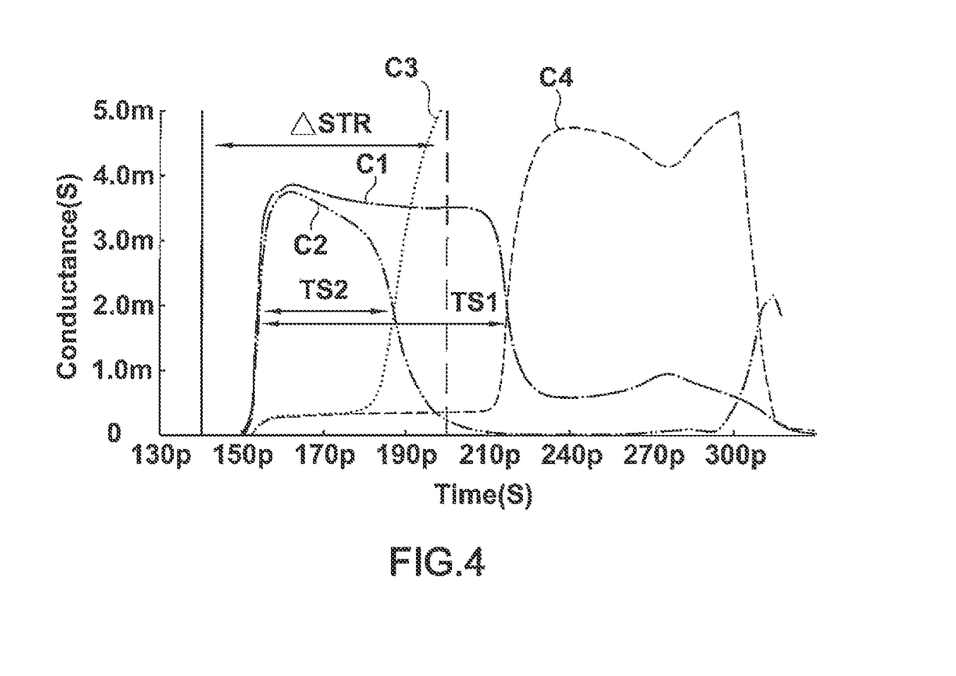
FIG. 4 illustrates small signal parameters behavior of the comparator 200 and a comparator of prior art according to an embodiment.

As described above, delay or an interval (hereinafter called ΔSTR) between the time when the first strobe signal STR1 is enabled (e.g. a high voltage level VDD) and the time when the second strobe signal STR2 is enabled (e.g. a high voltage level VDD) is adjustable. FIG. 4 illustrates small signal parameters behavior of the comparator 200 and a comparator of prior art according to an embodiment. Referring to FIG. 4 and FIG. 2, a curve C1 is a gain parameter behavior of gm of the transistors M1 and M2 in the comparator 200, and a curve C2 is a gain parameter behavior of gds of the transistors M1 and M2 in the comparator 200, and a curve C3 is a gain parameter behavior of gm of transistors of an input stage of a comparator according to prior art (only receiving one strobe input signal), and curve C4 is a gain parameter of gds of transistors of an input stage of a comparator according to prior art. Generally speaking, during a time period that a gain parameter of gm is less than a gain parameter of gds for a transistor, this transistor is at saturation region. It is observable that the saturation duration TS1 of the transistors M1 and M2 of the present invention is longer than the saturation duration TS2 of the input stage according to prior art. The comparator 200 of the invention utilizes different clock signals (strobe signals STR1 and STR2) for the comparing input unit 110 and the latching unit 120 respectively. Hence, comparing to prior art, the time in saturation of the input transistors M1 and M2 is extended to improve the speed sensitivity over the input voltage difference and noise performance.

Figure 5:
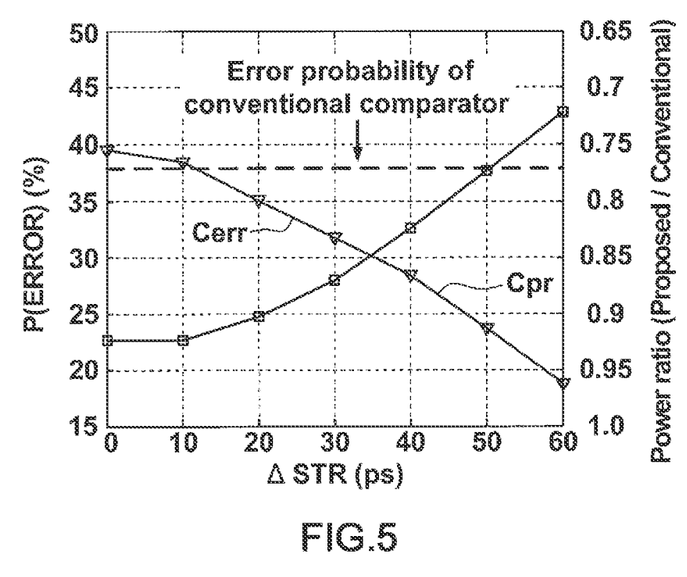
FIG. 5 illustrates a graph of the error probability and power consumption ratio of the comparator 200 of FIG. 2 over a comparator of prior art versus delay between the strobe signals STR1 and STR2 with input voltage difference at 0.2 mV.

FIG. 5 illustrates a graph of the error probability and power consumption ratio of the comparator 200 of FIG. 2 over a comparator of prior art versus delay between the strobe signals STR1 and STR2 with input voltage difference at 0.2 mV. Referring to FIG. 5, a curve Cerr shows the variation of error probability versus the delay ΔSTR and a curve Cpr shows the variation of power consumption ratio versus the delay ΔSTR. As shown in FIG. 5, the smaller the delay ΔSTR is, the higher the error probability grows. On the contrary, the lager the delay ΔSTR is, the higher the power consumption ratio increases. According to the comparator 200 of FIG. 2, with the same size of the input transistors M1 and M2, the architecture of the comparator 200 according to this embodiment achieves better noise performance under the condition of ΔSTR larger than 10 ps, with power consumption around 77% of the comparator 200. These results according to FIG. 5 show that the error of the comparator 200 increases rapidly as the time delay is reduced and the power consumption is proportionally shrunk versus delay. In addition, according to the embodiment of FIG. 5, the power consumption ratio of the delay ΔSTR at 60 ps is acceptable and the error probability of the delay ΔSTR at 60 ps is preferable.

Figure 6:
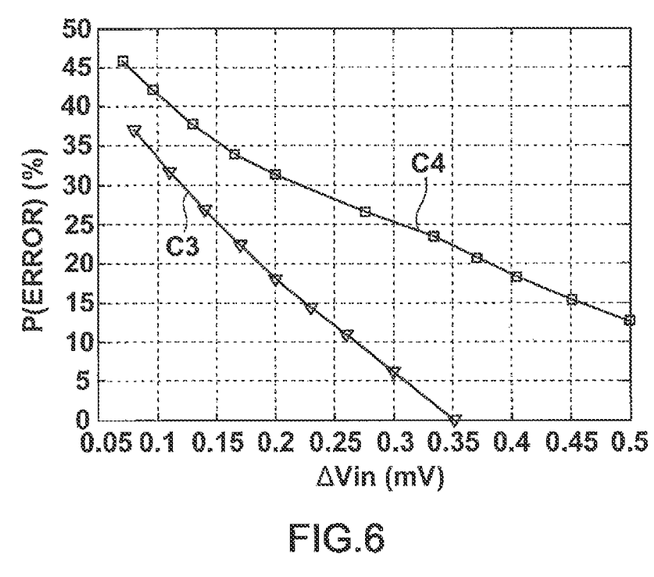
FIG. 6 shows a graph of the error probability comparison between the comparator 200 of FIG. 2 and a comparator of prior art with single strobe over different voltage differences between the comparing signals.

FIG. 6 shows a graph of the error probability comparison between the comparator 200 of FIG. 2 and a comparator of prior art with single strobe over different voltage differences between the comparing signals. Referring to FIG. 6, a curve C3 shows various error probabilities versus different voltage differences between comparing signals Vin+ and Vin− (ΔVin) according to the comparator 200 of FIG. 2 and a curve C4 shows various error probabilities versus different voltage differences between comparing signals Vin+ and Vin− (ΔVin) according to a comparator of prior art with single strobe. As shown in FIG. 6, the error probabilities of the comparator 200 of the invention are always lower than the error probabilities of a comparator of prior art with single strobe over all the voltage differences ΔVin.

Figure 7:
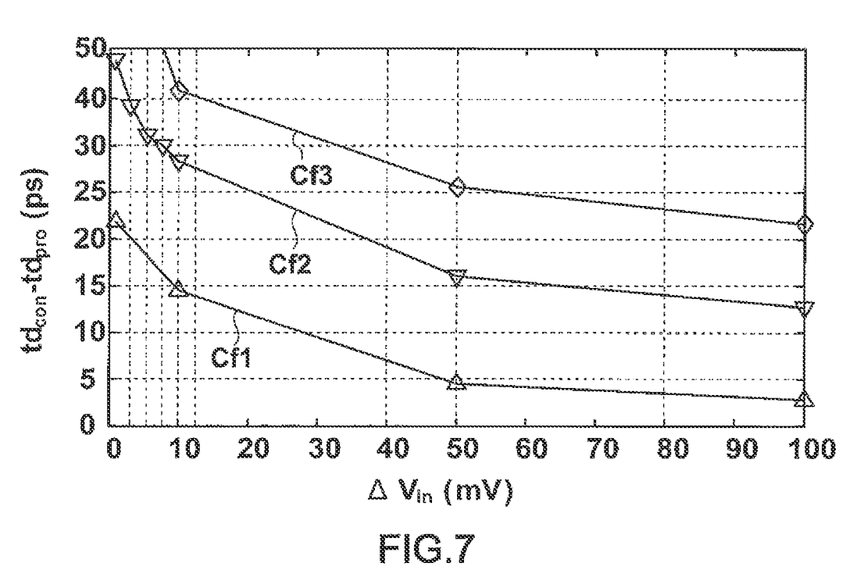
FIG. 7 shows a graph of the delay difference (tdcon−tdpro) at output nodes between a comparator of prior art and the comparator of the present invention over different voltage differences between the comparing signals.

FIG. 7 shows a graph of the delay difference (tdcon−tdpro) at output nodes between a comparator of prior art with single strobe (tdcon) and the comparator of the present invention (tdpro) over different voltage differences between the comparing signals. The delays tdcon and tdpro are measured from 70% of the rising output edge and 30% of the falling edge output. The comparator according to the present invention utilizes an output stage receiving an input clock signal without depending on the input of the comparator of the invention. Thus, it can be indicated that the delay of the comparator of the invention is less sensitive to its inputs and it can drive larger loads at the outputs thereof. Referring to FIG. 7, a curve Cf1 shows the delay differences under different voltage differences between comparing signals Vin+ and Vin− (ΔVin) with an output load of 10 fF, and a curve Cf2 shows the delay differences under different voltage differences (ΔVin) with an output load of 15 fF, and a curve Cf3 shows the delay differences under different voltage differences (ΔVin) with an output load of 20 fF. According to FIG. 7, the comparator of the present invention with two phases operates faster than a comparator of prior art with single strobe with 10 fF, 15 fF, and 20 fF loads (which are common load values for a comparator), since all the delay differences (tdcon−tdpro) in FIG. 7 are greater than zero.

Figure 8:
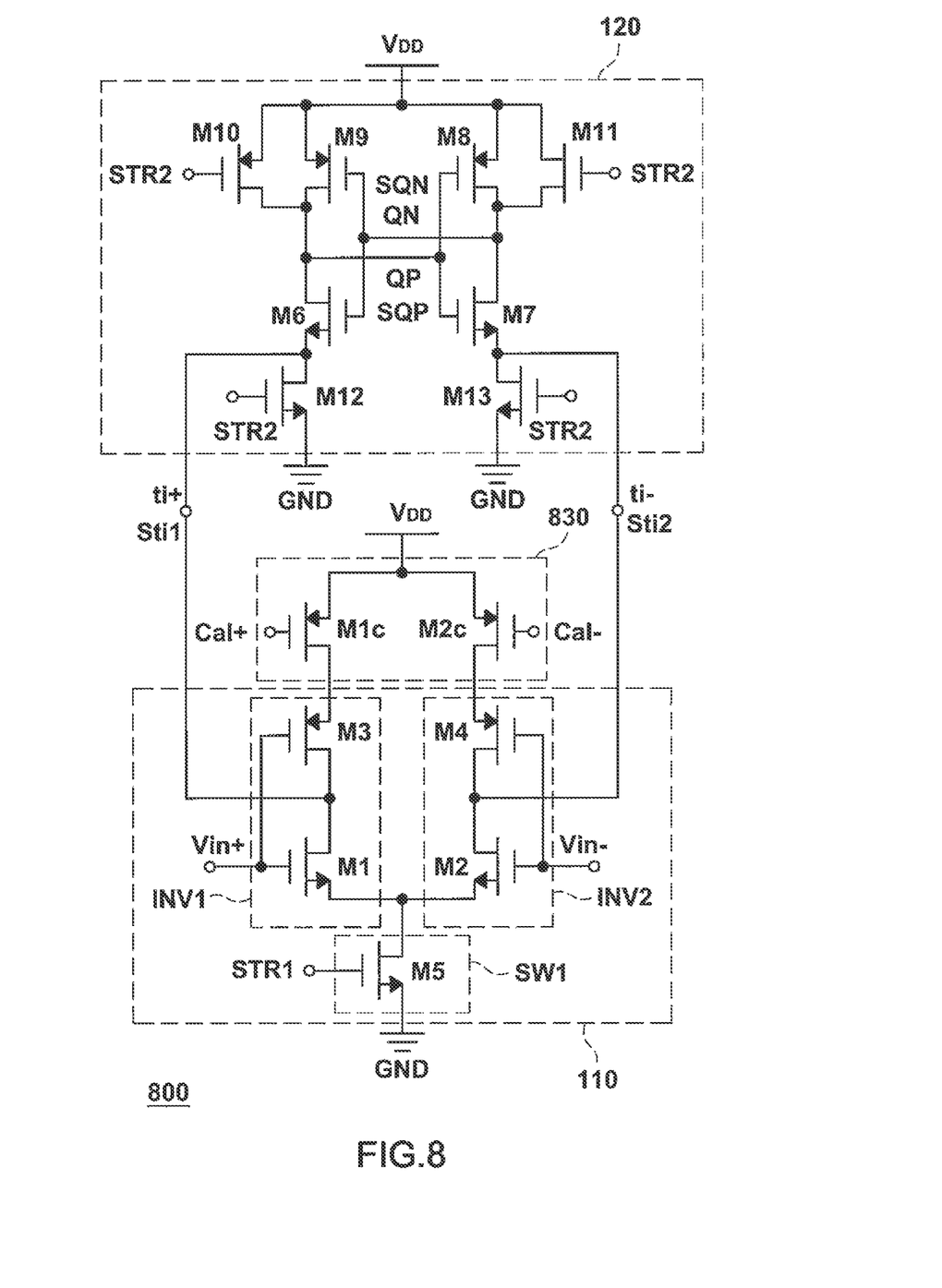
FIG. 8 shows a comparator 800 with calibration function according to an embodiment of the invention.

FIG. 8 shows a comparator 800 with calibration function according to an embodiment of the invention. Referring to FIG. 8, the comparator 800 includes a comparing input unit 110, a latching unit 120, and a calibration unit 830, wherein the comparing input unit 110 and the latching unit 120 are similar to those in the embodiment of FIG. 2 and will not be repeated here again. The calibration unit 830 is coupled on the path where the comparing input unit 120 receives a power voltage. The calibration unit 830 has two inputs receiving calibration signals Cal+ and Cal− respectively. When the inputs of the comparator 800 are in a common mode, that is, when both the inputs of the comparator 800 receives a common-mode voltage signal VCM respectively, the two outputs of the comparator 800 shall generate two identical voltage level signals. However, under certain case such as manufacturing process drift, even though all the transistors of the comparator 800 have the same size, the output signals of the comparator 800 are not identical when the inputs of the comparator 800 are in the common mode, and this condition causes the decision point of the comparator shifted. For solving this problem, the calibration unit 830 is used to calibrate the comparing result of the outputs of the comparator 800, and the comparing result is calibrated according to at least one of the calibration signals Cal+ and Cal−.

Specifically, the calibration unit 830 includes two transistors M1c and M2c (e.g. two p-type transistors). The transistor M1c has a source receiving the power voltage VDD which an inverter INV1 of the comparing input unit 110 receives. The transistor M1c has a gate receiving the calibration signal Cal+ and has a drain coupled to the inverter INV1 of the comparing input unit 110. In addition, the transistor M2c has a source receiving the power voltage VDD which an inverter INV2 of the comparing input unit 110 receives. The transistor M2c has a gate receiving the calibration signal Cal− and has a drain coupled to the inverter INV2 of the comparing input unit 110.

According to an embodiment of the invention, take a specific case which a result signal SQN is at a high voltage level (e.g. VDD) and a result signal SQP is at a low voltage level (e.g. GND) while the inputs of the comparator 800 are in the common mode. For calibrating the comparator 800, the calibration signal Cal− is driven down to e.g. a ground voltage GND and the transistor M2c is totally turned on. Meanwhile, the calibration signal Cal+ is adjusted for limiting currents through the transistor M1c by allowing the transistor M1c to work in a triode region of transistor. Thus, the outputs of the comparator 800 will be calibrated. Until the result signal SQN is equal to the result signal SQP, stop adjusting the calibration signal Cal+ and latch the voltage level of calibration signal Cal+ at the gate of the transistor M1c. Then, the calibration process is completed. Likewise, if the result signal SQN is at a low voltage level and the result signal SQP is at a high voltage level when the inputs of the comparator 800 are in the common mode, the gate of the transistor M1c will be coupled to a ground voltage GND and the calibration signal Cal− at the gate of the transistor M2c will be adjusted until the calibration process is accomplished.

Figure 9:
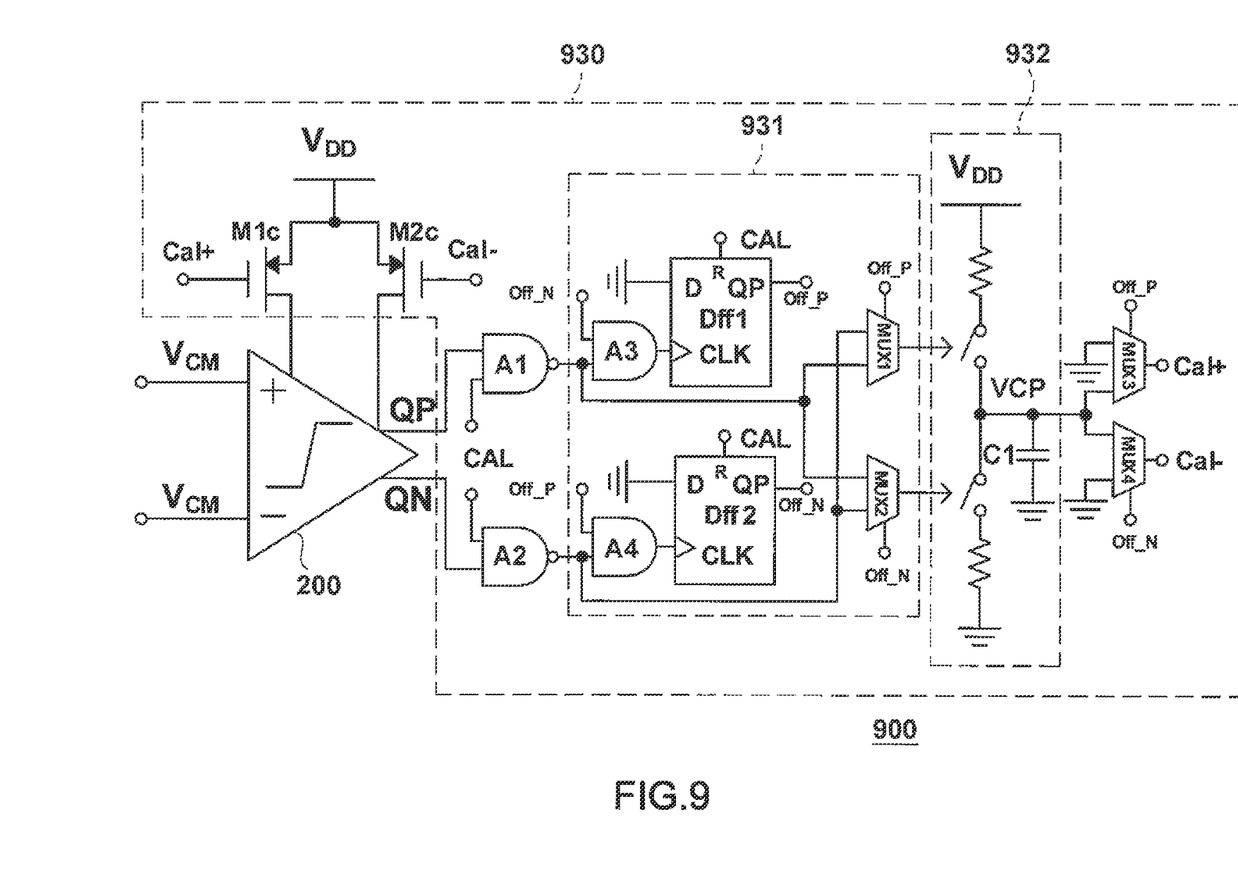
FIG. 9 shows a comparator 900 with calibration function according to an embodiment of the invention.

FIG. 9 shows a comparator 900 with calibration function according to an embodiment of the invention. Referring to FIG. 9, the comparator 900 includes a comparator 200 according to the embodiment of FIG. 2 and a calibration unit 930 wherein the comparator 200 is described clearly above and will not be repeated herein. The calibration unit 930 includes two transistors M1c and M2c coupled to the comparator 200 wherein the transistors M1c and M2c have the same coupled relation and function as those in the embodiment of FIG. 8 and will not be repeated herein. The calibration unit 930 further includes an NAND gate A1, an NAND gate A2, a digital logic circuit 931, a charge pump circuit 932, a multiplexer MUX3, and a multiplexer MUX4.

The NAND gate A1 is used to generate a reversed signal of a result signal SQP from the comparator 200 to an output of the NAND gate A1 when the calibration unit 930 is enabled according to a calibration enable signal CAL. The first NAND gate A1 has a first input receiving the calibration enable signal and has a second input receiving the result signal SQP. The NAND gate A2 is used to generate a reversed signal of a result signal SQN from the comparator 200 to an output of the NAND gate A2 when the calibration unit 930 is enabled. The NAND gate A2 has a first input receiving the calibration enable signal CAL and has a second input receiving the result signal SQN.

The digital logic circuit 931 is used to select at least one of the result signals SQN and SQP to be passed to an output thereof. The digital logic circuit 931 includes an AND gate A3, an AND gate A4, a D-flip-flop DFF1, a D-flip-flop DFF2, a multiplexer MUX1, and a multiplexer MUX2. Furthermore, the AND gate A3 has a first input coupled to the output of the NAND gate A1 and the AND gate A4 has a first input coupled to the output of the NAND gate A2. The D-flip-flop DFF1 has a clock terminal coupled to the output of the AND gate A3, has a reset terminal receiving the calibration enable signal CAL, and has an input receiving a ground voltage GND, and the D-flip-flop DFF1 generates an offset signal Off_P at an output thereof coupled to a second input of the AND gate A4. The D-flip-flop DFF2 has a clock terminal coupled to the output of the AND gate A4, has a reset terminal receives the calibration enable signal CAL, and has an input receiving a ground voltage GND, and the D-flip-flop DFF2 generates an offset signal Off_N at an output thereof coupled to a second input of the AND gate A3. According to an embodiment of the invention, when the reset terminals of D-flip-flops DFF1 and DFF2 receive the disabled calibration signal CAL (e.g.

CAL=0V) initially, the offset signals Off_N and Off_P are reset to e.g. a high voltage level such as Off_N=VDD and off_P-VDD. The multiplexer MUX1 has a select terminal receiving the offset signal Off_P and has two inputs receiving the result signals SQN and SQP respectively, and the multiplexer MUX1 is used to select one of the result signals SQN and SQP to be passed to an output of the multiplexer MUX1 according to the offset signal Off_P. Besides, the multiplexer MUX2 has a select terminal receiving the offset signal Off_N and has two inputs receiving the result signals SQN and SQP respectively, and the multiplexer MUX2 is used to select one of the result signals SQP and SQN to be passed to an output of the multiplexer MUX2 according to the offset signal Off_N.

The charge pump circuit 932 is used to receive at least one of the reversed signals of the results signal SQN and SQP and generate a calibration voltage VCP at an output of the charge pump circuit 932. The multiplexer MUX3 has a select terminal receiving the offset signal Off_P, has a first input receiving a ground voltage GND, and has a second input receiving the calibration voltage VCP, and the multiplexer MUX3 generates the calibration signal Cal+ according to the offset signal Off_P. In addition, the multiplexer MUX4 has a select terminal receiving the offset signal Off_N, has a first input receiving a ground voltage GND, and has a second input receiving the calibration voltage VCP, and the multiplexer MUX4 generates the calibration signal Cal− according to the offset signal Off_N.

According to an embodiment of the invention, the calibrating operation of the comparator 900 is described as follows. During calibration, the calibration enable signal CAL is enabled by e.g. a power voltage VDD. The common-mode voltage signal VCM is applied to the inputs of the comparator 900 and the outputs of the comparator 900 trigger one of the D-flip-flops DFF1 and DFF2 which discharges the output thereof from a power voltage VDD to a ground voltage GND depending on the offset polarity. Then, the offset signal Off_N or the offset signal Off_P determines which outputs of the comparator 900 (node QN or node QP) and the nodes of the calibration signals Cal+ and Cal− are being connected to the charge pump circuit 932 through the multiplexers MUX1 and MUX2, and the multiplexers MUX3 and MUX4, respectively. At last, the charge pump circuit 932 will investigate the calibration voltage VCP from a ground voltage GND to a power voltage VDD and stops when the offset is adjusted to zero. With this scheme, the voltage change of the calibration signal Cal+/Cal− varies the resistance of the transistor M1c/M2c, and compensates the current difference on both branches of the comparator 900. Since triode region load is adopted, one of the calibration nodes can be simply connected to a ground voltage GND rather than to a bias circuit according to prior art. Moreover, a compensation offset voltage generated from the transistors M1c and M2c is divided by the gain of the comparator 900 at the comparing input unit of the comparator 200 which increases the resolution and lowers the noise sensitivity of the whole calibration.

For a specific case as an example that the voltage level of the result signal SQN is greater than the result signal SQP, during calibration, the offset signals Off_N and Off_P are at e.g. power voltage VDD initially. While receiving the enabled calibration enable signal CAL (e.g. CAL=VDD), the offset signal Off_N at e.g. a power voltage VDD is transferred to the clock terminal of the D-flip-flop DFF2. At the moment that the result signal SQN is e.g. rising at the clock terminal of the D-flip-flop DFF2, a ground voltage at the input of the D-flip-flip DFF2 is transferred to the output of the D-flip-flop DFF2 to pull low the offset signal Off_N. At the same time, the path for transferring the result signal SQP to the D-flip-flop DFF1 is turned off by the offset signal Off_N. Afterwards, the charge pump circuit 932 which is coupled to the digital logic circuit 931 is activated according to the result signal SQN through the multiplexers MUX1 and MUX2. By charging and discharging e.g. a capacitance C1 of the charge pump circuit 932, the charge pump circuit 932 investigates the calibration voltage VCP until the offset is adjusted to zero (SQP=SQN). After adjusting the offset, the charge pump circuit 932 stops and the calibration voltage VCP is coupled to the gate of the transistor M1c as the calibration signal Cal+ through the multiplexer MUX3 according to the offset signal Off_P. Also at this time, a ground voltage GND is coupled to the gate of the transistor M2c as the calibration signal Cal− through the multiplexer MUX4 according to the offset signal Off_N. Then, the calibration process is accomplished. Likewise, during calibration, when the voltage level of the result signal SQP is greater than the result signal SQN, the calibration voltage VCP is coupled to the gate of the transistor M2c and a ground voltage is coupled to the gate of the transistor M1c.

Figure 10:
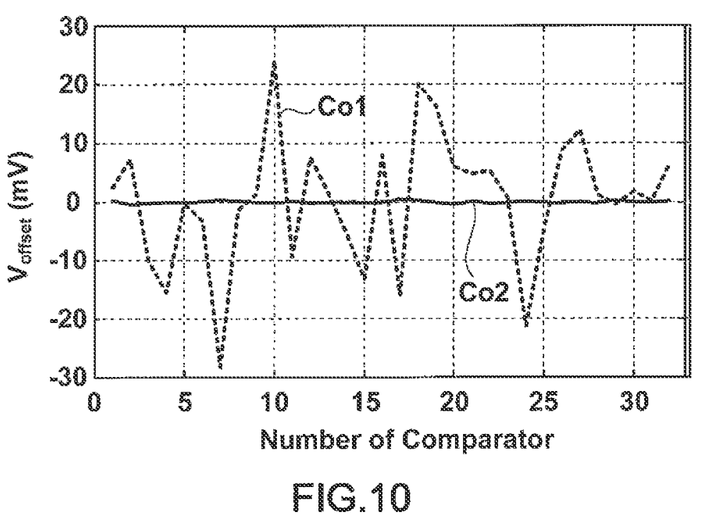
FIG. 10 shows a graph of offset voltage of the output of the comparator 900 versus the number of the comparator 900 according to an embodiment of the invention.

FIG. 10 shows a graph of offset voltage of the output of the comparator 900 versus the number of the comparator 900 according to an embodiment of the invention. Referring to FIG. 10, a curve Co1 describes various offset voltages under different numbers of comparator 900 without calibration and a curve Co2 describes various offset voltages under different numbers of comparator 900 with calibration. As shown in FIG. 10, the curve Co1 without calibration oscillates dramatically while the curve Co2 with calibration is stable around 0V of offset voltage.

Figure 11:
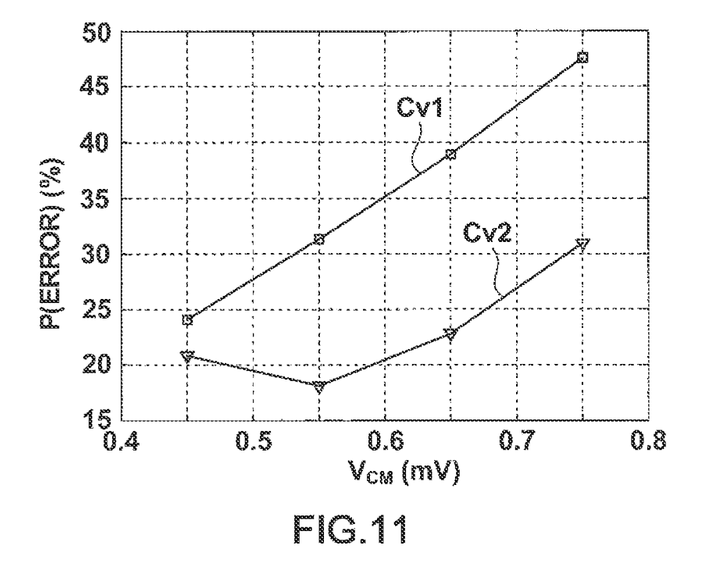
FIG. 11 shows the noise performance of the comparator 900 and a comparator of prior art with single strobe versus common mode voltage signal VCM according to an embodiment of the invention.

FIG. 11 shows the noise performance of the comparator 900 and a comparator of prior art with single strobe versus common mode voltage signal VCM according to an embodiment of the invention. Referring to FIG. 11, a curve Cv1 describes the error probability versus the common mode voltage of the comparator of prior art with single strobe and a curve Cv2 describes the error probability versus the common mode voltage of the comparator 900. It is observable that the architecture of the comparator 900 of the present invention has lower input referred noise in a wide range of input common mode voltages compared to prior art with single strobe.

It is deserved to be mentioned that the comparator of the present invention has been implemented compactly in 90 nm CMOS process with 1.2V supply. In the implementation, the clock generator and the calibration unit are separated from the main comparator through a layout placement. The area of clock generator and the calibration unit, and the area of the main comparator are 1.14 μm^2 and 0.6 μm^2 respectively.

In summary, the present invention presents a two stage dynamic comparator with offset calibration wherein the first stage is referred to a comparing input unit and the second stage is referred to a latching unit. The comparator of the present invention exhibits low noise, low offset at high speed of operation. A variable delay between the clocks (strobe signals) from the first and second stages of the comparator allows more time for the input transistors to operate in the saturation region while at the same time achieving reconfigurability over noise, offset and power performance. In addition, the architecture of the present invention improves noise and output-stage driving capability of comparator. On the other hand, an efficient offset calibration technique admits also a more compact design.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

What is claimed is:

1. A comparator, comprising:

a comparing input unit, having a first input receiving a first comparing signal, having a second input receiving a second comparing signal, the comparing input unit driving a first intermediate node signal at a first intermediate node depending on the first comparing signal according to a first strobe signal, and the comparing input unit driving a second intermediate node signal at a second intermediate node depending on the second comparing signal according to the first strobe signal;

a latching unit, receiving the first intermediate node signal from the first intermediate node, receiving the second intermediate node signal from the second intermediate node, the latching unit determining a comparing result according to at least one of the first intermediate node signal and the second intermediate node signal, and the latching unit latching the comparing result according to a second strobe signal; and a calibration unit, coupled on the path where the comparing input unit receiving a power voltage, the calibration unit having a first calibration input receiving a first calibration signal and a second calibration input receiving a second calibration signal, wherein the calibration unit calibrates the comparing result according to at least one of the first calibration signal and the second calibration signal when the inputs of the comparator are in a common mode.

2. The comparator as claimed in claim 1, wherein during a comparing phase, the comparing input unit performs comparing according to the first strobe signal; during a latching phase, the latching unit latches the comparing result according to the second strobe signal.

3. The comparator as claimed in claim 1, wherein during a reset phase, the comparator resets the comparing result according to the first strobe signal and the second strobe signal.

4. The comparator as claimed in claim 1, wherein the comparing input unit comprises:

a first inverter, having a power terminal receiving a power voltage, having an input receiving the first comparing signal, and having an output coupled to the first intermediate node;

a second inverter, having a power terminal receiving the power voltage, having an input receiving the second comparing signal, and having an output coupled to the second intermediate node; and a switch, having a control terminal receiving the first strobe signal, having a first terminal receiving a ground voltage, and having a second terminal coupled to a ground terminal of the first inverter and coupled to a ground terminal of the second inverter, wherein the switch is turned on to form a current path when the first inverter and the second inverter drive voltages at the first intermediate node and at the second intermediate node respectively.

5. The comparator as claimed in claim 4, wherein the first inverter comprises:

a first transistor, having a gate receiving the first comparing signal, having a source coupled to the switch, and having a drain coupled to the first intermediate node; and a second transistor, having a gate receiving the first comparing signal, having a source receiving the power voltage, and having a drain coupled to the drain of the first transistor.

6. The comparator as claimed in claim 4, wherein the second inverter comprises:

a first transistor, having a gate receiving the second comparing signal, having a source coupled to the switch, and having a drain coupled to the second intermediate node; and a second transistor, having a gate receiving the second comparing signal, having a source receiving the power voltage, and having a drain coupled to the drain of the first transistor.

7. The comparator as claimed in claim 4, wherein the switch comprises:

a transistor, having a gate receiving the first strobe signal, having a source receiving a ground voltage, having a drain coupled to the ground terminal of the first inverter and coupled to the ground terminal of the second inverter.

8. The comparator as claimed in claim 1, wherein the latching unit comprises:

a first inverter, having a power terminal receiving a power voltage, having a ground terminal receiving the first intermediate node signal, having an input receiving a first result signal from a first result node, and having an output generating a second result signal at a second result node;

a second inverter, having a power terminal receiving the power voltage, having a ground terminal receiving the second intermediate node signal, having an input receiving the second result signal from the second result node, and having an output generating the first result signal at the first result node;

a first switch, having a control terminal receiving the second strobe signal, having a first terminal receiving the power voltage, and having a second terminal coupled to the second result node;

a second switch, having a control terminal receiving the second strobe signal, having a first terminal receiving the power voltage, and having a second terminal coupled to the first result node;

a third switch, having a control terminal receiving the second strobe signal, having a first terminal receiving a ground voltage, and having a second terminal coupled to a ground terminal of the first inverter; and a fourth switch, having a control terminal receiving the second strobe signal, having a first terminal receiving the ground voltage, and having a second terminal coupled to a ground terminal of the second inverter, wherein the first switch and the second switch are turned on according to a first state of the second strobe signal, and the third switch and the fourth switch are turned on according to a second state of the second strobe;

wherein the first inverter and the second inverter are formed as back-to-back inverters to latch the comparing result when the third switch and the fourth switch are turned on;

wherein the first switch and the second switch are turned on to form a comparing current path when the comparing input unit drives the first intermediate node signal and the second intermediate node signal at the first intermediate node and at the second intermediate node respectively; and wherein the third switch and the fourth switch are turned on to form a first latching current path and a second latching current path when the latching unit latches the comparing result.

9. The comparator as claimed in claim 8, wherein the first inverter comprises:

a first transistor, having a source coupled to the first intermediate node, having a gate receiving the first result signal, having a drain coupled to the input of the second inverter; and a second transistor, having a source receiving a power voltage, having a gate receiving the first result signal, having a drain coupled to the drain of the first transistor.

10. The comparator as claimed in claim 8, wherein the second inverter comprises;

a first transistor, having a source coupled to the second intermediate node, having a gate receiving the second result signal, having a drain coupled to the input of the first inverter; and a second transistor, having a source receiving a power voltage, having a gate receiving the second result signal, having a drain coupled to the drain of the first transistor.

11. The comparator as claimed in claim 8, wherein the first switch comprises:

a transistor, having a source receiving a power voltage, having a gate receiving the second strobe signal, and having a drain coupled to the output of the first inverter.

12. The comparator as claimed in claim 8, wherein the second switch comprises:

a transistor, having a source receiving a power voltage, having a gate receiving the second strobe signal, and having a drain coupled to the output of the second inverter.

13. The comparator as claimed in claim 8, wherein the third switch comprises:

a transistor, having a source receiving a ground voltage, having a gate receiving the second strobe signal, having a drain coupled to the ground terminal of the first inverter.

14. The comparator as claimed in claim 8, wherein the fourth switch comprises:

a transistor, having a source receiving a ground voltage, having a gate receiving the second strobe signal, having a drain coupled to the ground terminal of the second inverter.

15. The comparator as claimed in claim 1, wherein the calibration unit comprises:

a first transistor, having a source receiving the power voltage, having a gate receiving the first calibration signal, and having a drain coupled to a first inverter of the comparing input unit; and a second transistor, having a source receiving the power voltage, having a gate receiving the second calibration signal, and having a drain coupled to a second inverter of the comparing input unit.

16. The comparator as claimed in claim 1, wherein the calibration unit calibrates the comparing result according to at least one of a first result signal and a second result signal of the latching unit and the calibration unit is enabled according to a calibration enable signal.

17. The comparator as claimed in claim 16, wherein the calibration unit further comprises:

a first NAND gate, used to generate a reversed signal of the second result signal at an output of the first NAND gate when the calibration unit is enabled, the first NAND gate having a first input receiving the calibration enable signal, and having a second input receiving the second result signal;

a second NAND gate, used to generate a reversed signal of the first result signal to an output of the second NAND gate when the calibration unit is enabled, the second NAND gate having a first input receiving the calibration enable signal, and having a second input receiving the first result signal;

a digital logic circuit, used to select at least one of the first result signal and the second result signal passed to an output of the digital logic circuit, the digital logic circuit comprising:

a first AND gate, having a first input coupled to the output of the first NAND gate;

a second AND gate, having a first input coupled to the output of the second NAND gate;

a first D flip-flop, having a clock terminal coupled to the output of the first AND gate, having a reset terminal receiving the calibration enable signal, having an input receiving a ground voltage, and generating a second offset signal at a second input of the second AND gate;

a second D flip-flop, having a clock terminal coupled to the output of the second AND gate, having a reset terminal receiving the calibration enable signal, having an input receiving a ground voltage, and generating a first offset signal at a second input of the first AND gate;

a first multiplexer, having a select terminal receiving the second offset signal, having a first and a second input receiving the first result signal and the second result signal respectively, and the first multiplexer used to select one of the first result signal and the second result signal passed to an output of the first multiplexer according to the second offset signal; and a second multiplexer, having a first select terminal receiving the first offset signal, having a first and a second input receiving the second result signal and the first result signal respectively, and the second multiplexer used to select one of the second result signal and the first result signal passed to an output of the second multiplexer according to the first offset signal;

a charge pump circuit, used to receive at least one of the first result signal and the second result signal and generate a calibration voltage;

a third multiplexer, having a select terminal receiving the second offset signal, having a first input receiving a ground voltage and having a second input receiving the calibration voltage, and the third multiplexer generating the first calibration signal according to the second offset signal; and a fourth multiplexer, having a select terminal receiving the first offset signal, having a first input receiving a ground voltage, and having a second input receiving the charge pump voltage, and the fourth multiplexer generating the second calibration signal according to the first offset signal.

18. The comparator as claimed in claim 1, wherein the an interval between the time when the first strobe signal is enabled and the time when the second strobe signal is enabled is adjustable to control the dynamic gain of the comparing input unit.

19. The comparator as claimed in claim 18, wherein a delay time between the first strobe signal and the second strobe signal is greater than 0 second while keeping the first strobe signal and the second strobe signal being overlapped.

* * * * *